(12) United States Patent
Lee et al.

(10) Patent No.: US 10,017,851 B2
(45) Date of Patent: *Jul. 10, 2018

(54) MAGNETIC FIELD ANNEALING FOR INTEGRATED FLUXGATE SENSORS

(71) Applicant: Texas Instruments Incorporated, Dallas, TX (US)

(72) Inventors: Dok Won Lee, Mountain View, CA (US); Mona Eissa, Allen, TX (US); Neal Thomas Murphy, Fairview, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/979,003

(22) Filed: Dec. 22, 2015

(65) Prior Publication Data
US 2017/0175259 A1    Jun. 22, 2017

(51) Int. Cl.
G01R 33/04     (2006.01)
C23C 16/06     (2006.01)
C23C 16/56     (2006.01)
G01R 33/05     (2006.01)

(52) U.S. Cl.
CPC ............ *C23C 16/06* (2013.01); *C23C 16/56* (2013.01); *G01R 33/04* (2013.01); *G01R 33/045* (2013.01); *G01R 33/05* (2013.01)

(58) Field of Classification Search
CPC ....... G01R 33/04; G01R 33/045; G01R 33/05
See application file for complete search history.

(56) References Cited

U.S. PATENT DOCUMENTS

| | | | | |
|---|---|---|---|---|
| 5,096,513 A * | 3/1992 | Sawa | .................. | B22D 11/0611 148/304 |
| 5,199,178 A * | 4/1993 | Tong | ...................... | G01C 17/30 324/247 |
| 6,407,547 B1 * | 6/2002 | Yamada | .................. | G01R 33/05 324/249 |
| 6,483,662 B1 * | 11/2002 | Thomas | ................ | G11B 5/3116 360/123.4 |
| 7,262,680 B2 * | 8/2007 | Wang | .................. | H01F 17/0013 257/531 |
| 2004/0232913 A1 * | 11/2004 | Schott | .................... | G01R 33/05 324/253 |

(Continued)

*Primary Examiner* — Mandy C Louie
(74) *Attorney, Agent, or Firm* — Andrew R. Ralston; Charles A. Brill; Frank D. Cimino

(57) ABSTRACT

A method of magnetic forming an integrated fluxgate sensor includes providing a patterned magnetic core on a first nonmagnetic metal or metal alloy layer on a dielectric layer over a first metal layer that is on or in an interlevel dielectric layer (ILD) which is on a substrate. A second nonmagnetic metal or metal alloy layer is deposited including over and on sidewalls of the magnetic core. The second nonmagnetic metal or metal alloy layer is patterned, where after patterning the second nonmagnetic metal or metal alloy layer together with the first nonmagnetic metal or metal alloy layer encapsulates the magnetic core to form an encapsulated magnetic core. After patterning, the encapsulated magnetic core is magnetic field annealed using an applied magnetic field having a magnetic field strength of at least 0.1 T at a temperature of at least 150° C.

15 Claims, 8 Drawing Sheets

(56) References Cited

U.S. PATENT DOCUMENTS

| | | | |
|---|---|---|---|
| 2007/0085535 A1* | 4/2007 | Na | G01R 33/05 324/253 |
| 2009/0145524 A1* | 6/2009 | Ogawa | H01F 1/15308 148/304 |
| 2014/0285189 A1* | 9/2014 | Kashmiri | G01R 33/04 324/253 |
| 2015/0048820 A1* | 2/2015 | Schaffer | G01R 33/04 324/253 |
| 2015/0338474 A1 | 11/2015 | Mohan et al. | |
| 2016/0154069 A1* | 6/2016 | Eissa | G01R 33/0052 324/253 |
| 2016/0155935 A1* | 6/2016 | Eissa | C23F 1/02 438/48 |

* cited by examiner

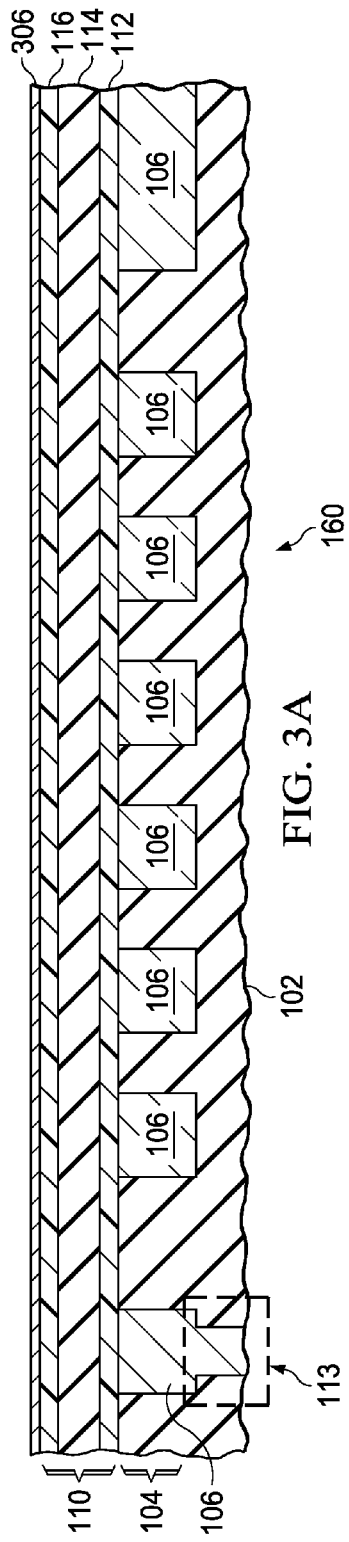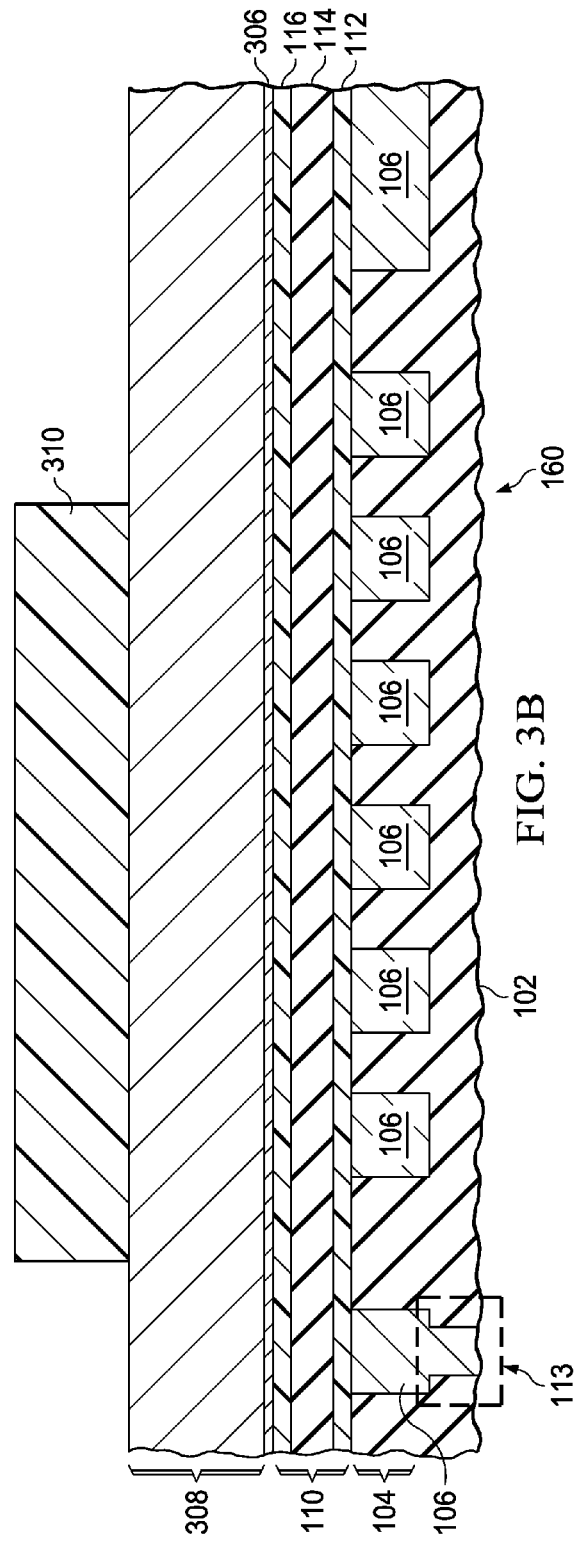

MAGNETIC FIELD ANNEALING FOR INTEGRATED FLUXGATE SENSORS

CROSS-REFERENCE TO COPENDING APPLICATIONS

This application has subject matter related to copending patent application Ser. No. 14/557,611 entitled "High Performance Fluxgate Device" that was filed on Dec. 2, 2014.

FIELD

Disclosed embodiments relate to integrated fluxgate sensors.

BACKGROUND

A magnetic sensor is a device that measures the strength of an external magnetic field. There are a number of different approaches for sensing magnetic fields, and various different types of known magnet sensors which are based on these different approaches. One type of magnetic sensor that is based on flux variations in a magnetic core is a fluxgate sensor.

A conventional fluxgate sensor includes a separate drive coil, a sense coil, and a magnetic core structure that lies within the drive coil and sense coil. Another fluxgate sensor is an integrated fluxgate sensor that is formed as a multi-layer structure including a magnetic core having assonated via-based drive and sense coil structures formed on a semiconductor substrate. Typical applications for fluxgate sensors include magnetic closed-loop current sensing in motor controls, renewable energy, battery chargers and power monitoring.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize as-deposited magnetic layers for magnetic cores of integrated fluxgate sensors may have significant across-wafer (die-to-die) variation of magnetic alignment. Magnetic field annealing has the capability to reduce the across-wafer variation of magnetic alignment which is important because magnetic alignment can have a strong beneficial impact on key parameters of fluxgate sensors, including sensitivity and noise. However, while it is desirable to apply magnetic field annealing right after forming the magnetic core to maximize the benefit of the magnetic field annealing, it has surprisingly been found that annealing right after forming the magnetic core can cause structural defects including cracks and delamination of the magnetic core due to thermal expansion mismatches during subsequent processing.

Disclosed embodiments include methods of forming an integrated fluxgate sensor including providing a patterned magnetic core on a first nonmagnetic metal or metal alloy layer on a dielectric layer over a first metal layer that is on or is in an interlevel dielectric layer (ILD) which is on a substrate. A second nonmagnetic metal or metal alloy layer is deposited including over and on the sidewalls of the magnetic core. The second nonmagnetic metal or metal alloy layer is patterned, where after patterning the second nonmagnetic metal or metal alloy layer together with the first nonmagnetic metal or metal alloy layer encapsulates the magnetic core to form an encapsulated magnetic core. After patterning, the encapsulated magnetic core is magnetic field annealed using an applied magnetic field having a magnetic field strength of at least 0.1 T at a temperature of at least 150° C.

BRIEF DESCRIPTION OF THE DRAWINGS

Reference will now be made to the accompanying drawings, which are not necessarily drawn to scale, wherein:

FIG. 3A through FIG. 3F are cross sectional depictions of the fluxgate sensor shown in FIG. 1 depicted in successive stages of fabrication, according to an example embodiment.

DETAILED DESCRIPTION

Figure 1:
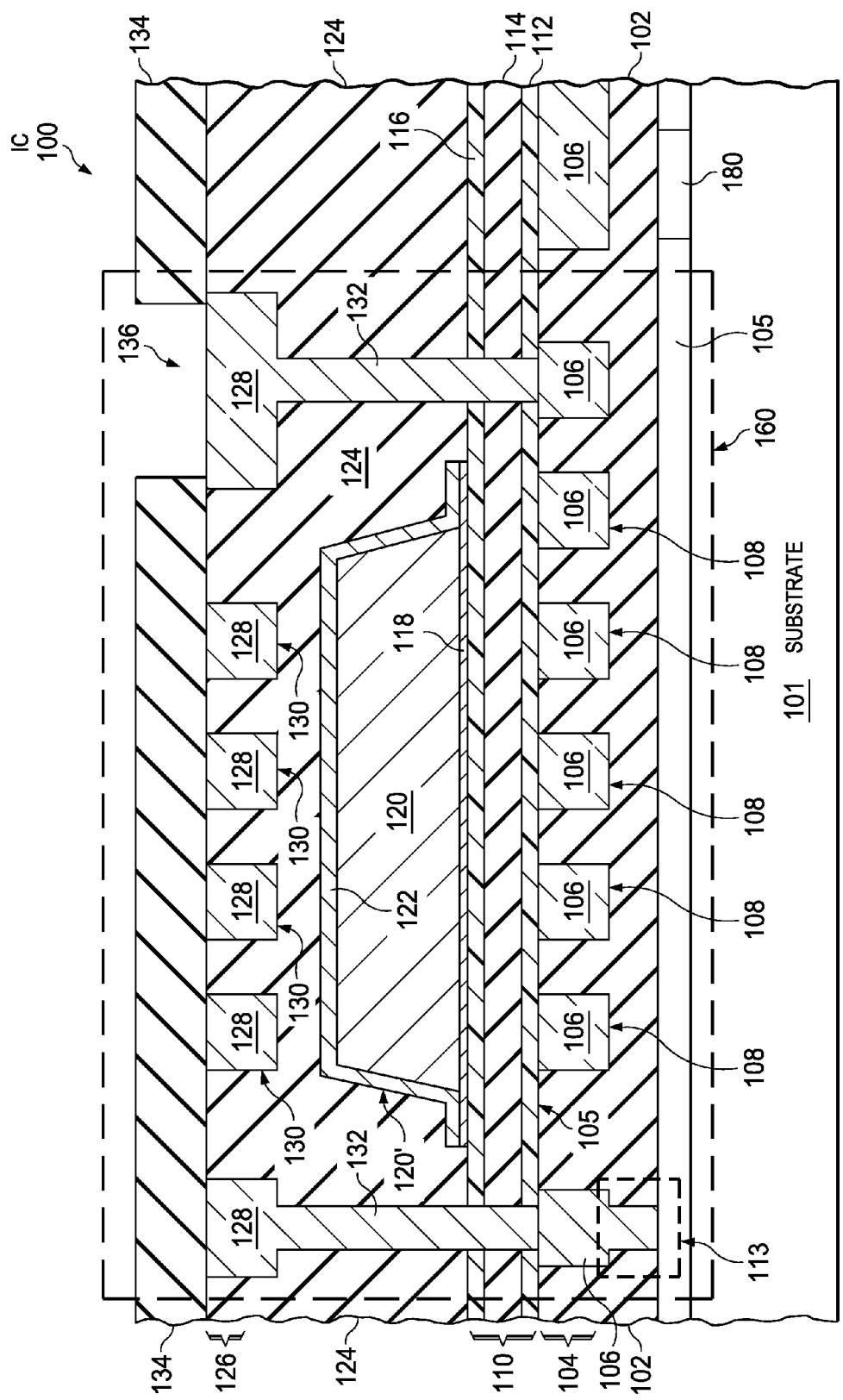
FIG. 1 is a cross sectional depiction of an example integrated circuit (IC) including an integrated fluxgate sensor along with functional circuitry formed on a semiconductor surface layer on a substrate, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Disclosed embodiments include magnetic field annealing for an IC including an integrated fluxgate sensor (or fluxgate magnetometer) formed on a semiconductor surface layer on a substrate, comprising a magnetic core that is encapsulated in a nonmagnetic metal or metal alloy such as Ti, Ta, Ru, and Pt or a nonmagnetic alloy such as TiN, TaN or AlN. Encapsulation of the magnetic core reduces stress and prevents magnetic core delamination. In addition, encapsulation of the magnetic core in a nonmagnetic metal or a nonmagnetic alloy significantly reduces and generally almost eliminates stress cracking.

Disclosed embodiments recognize encapsulation of the magnetic core for integrated fluxgate sensors enables magnetic cores with larger dimensions (length, width, and thickness) to be formed on the IC. Titanium metal is used as the encapsulating layer in the following description for illustration purposes, but it is understood that other nonmagnetic metal or metal alloy materials such Ta, Ru, Pt, TiN, TaN, and AlN may be used instead of titanium. Accordingly, as used herein, the term "nonmagnetic metal" includes Ti, Ta, Ru, and Pt metals, while the term "nonmagnetic alloy" includes TiN, TaN and AlN.

FIG. 1 is a cross section of an example IC 100 including an integrated fluxgate sensor 160 along with functional circuitry 180 formed on a semiconductor surface layer 105 on a substrate 101. The substrate 101 and/or semiconductor surface layer 105 can comprise silicon, silicon-germanium, or other semiconductor material. One particular arrangement is a silicon/germanium (SiGe) semiconductor surface layer 105 on a silicon substrate 101.

The IC 100 includes a first ILD layer 102 which may comprise a silicon dioxide-based material, such as organosilicate glass (OSG), silicon nitride or silicon oxynitride, and/or a low dielectric constant (low-k being a k-value below that of silica which is about 3.9) dielectric. A plurality of first metal lines 104 generally comprising copper damascene structures are disposed in the first ILD layer 102, extending to a top of the first ILD layer 102. Each instance of the first metal line 104 generally includes a refractory metal liner (not shown) of tantalum and/or tantalum nitride, and a first metal layer 106 (e.g., copper) providing filling on the metal liner. One or more of the first metal lines 104 may be connected to first vias 113 having copper damascene structures, disposed in the first ILD layer 102. The first metal lines 104 and first vias 113 may be dual-damascene structures as depicted in FIG. 1, or may be single damascene structures.

A first dielectric stack 110 comprising second etch stop layer 116 on a second dielectric layer 114 on first etch stop layer 112 is shown disposed on the first ILD layer 102 and on the first metal lines 104. The first dielectric stack 110 may be 500 nm to 1,000 nm (1 μm) thick. The first etch stop layer 112 is over the first ILD layer 102 and over the first metal lines 104. The first etch stop layer 112 may be primarily silicon nitride-based dielectric material, such as 50 nms to 150 nms thick, which can reduce copper migration from the first metal lines 104.

The second dielectric layer 114 may be a silicon dioxide layer 500 nm to 800 nm thick formed by plasma enhanced chemical vapor deposition (PECVD) using tetraethyl orthosilicate, also known as tetraethoxysilane (TEOS) as a precursor. The second etch stop layer 116 is formed over the second dielectric layer 114. The second etch stop layer 116 may be primarily a silicon nitride-based dielectric material, typically 50 nm to 150 nm thick, and provides an etch stop for the subsequent magnetic core encapsulation etching step.

A first titanium layer 118 with a thickness of generally about 30 nm to 50 nm is disposed on top of the second etch stop layer 116 and under the magnetic core 120. The first titanium layer 118 generally extends laterally past the magnetic core 120 by at least about 1.5 microns on all sides. The magnetic core material is generally a soft magnetic alloy including NiFe-based alloys such as permalloy and NiFeMo and CoZr based alloys such as CoNbZr and CoTaZr. The magnetic core may also be a laminate structure composed of alternating layers of the soft magnetic alloy and a thin layer of a dielectric such as aluminum nitride (AlN), aluminum oxide ($Al_2O_3$), or silicon dioxide ($SiO_2$). In an example integrated fluxgate sensor the magnetic core is a laminate structure of alternating layers of permalloy and AlN about 1.5 microns thick.

A second titanium layer 122 with a thickness of generally about 90 nm to 300 nm is disposed over the magnetic core 120 and covers the top and the sides (sidewalls) of the magnetic core 120. The second titanium layer 122 also generally laterally extends past the magnetic core 120 by at least about 1.5 microns on all sides. The first titanium layer 118 and the second titanium layer 122 can laterally extend past the magnetic core by about the same distance. The first titanium layer 118 which is disposed under the magnetic core 120 plus the second titanium layer 122 which is disposed over the top and sides of the magnetic core 120 completely encapsulates the magnetic core 120 with titanium to form an encapsulated magnetic core 120'.

A second ILD layer 124 is disposed over the first dielectric stack 110 and over the first titanium layer 118, the magnetic core 120, and the second titanium layer 122. The thickness of the second ILD layer 124 depends upon the thickness of the magnetic core 120. In an example fluxgate magnetometer the thickness of the second ILD layer is about 3.5 microns of silicon dioxide deposited using a PECVD TEOS process.

A plurality of second vias 132 having copper damascene structures are disposed in the second ILD layer 124. Some of the second vias 132 extend through the first dielectric stack 110 and make connections to the lines of the first metal layer 106. The second vias 132 may be part of dual-damascene structures which include second metal lines 126 over the second vias 132, as depicted in FIG. 1. Each instance of the second metal lines 126 generally includes a refractory metal liner (not shown) of tantalum and/or tantalum nitride, and a second metal layer 128 (e.g., copper) providing filling on the metal liner. Alternatively, the second vias 132 may be single damascene structures. The IC 100 may include an protective overcoat (i.e., passivation) layer 134 disposed over the second ILD layer 124 and over the second metal lines 126 with a bond pad opening 136 formed in the overcoat layer 134 as shown in FIG. 1. Alternatively the IC 100 may include a third etch stop layer disposed over the second ILD layer 124 and second metal lines 126 and possibly a third ILD layer over the third etch stop layer.

The second metal leads 130 above the magnetic core 120 are connected to the first metal leads 108 under the magnetic core 120 by a first set of vias (first vias) 113 that can be disposed in front of the magnetic core 120 and by a second set of vias (second vias) 132 that can be disposed behind the magnetic core 120. These second vias 132 connect the first metal leads 108 to the second metal leads 130 to form a coil (see coil 212 shown in FIG. 2) which surrounds the magnetic core 214. The first metal leads 108 may be connected to second metal leads 130 to form more than one coil surrounding the magnetic core 120. The coils are electrically isolated from the magnetic core 120 by the first dielectric stack 110 and by the second ILD layer 124.

Functional circuitry 180 is generally integrated circuitry that realizes and carries out a desired functionality that is formed on semiconductor surface layer 105. The first vias 113 through the ILD 102 can provide at least some of the coupling of the fluxgate sensor 160 to the functional circuitry 180 formed on the semiconductor surface layer 105 on the substrate 101. Some of the coupling can come from the metal lines as well, such as using some of the second metal lines 126. The capability of the functional circuitry 180 provided may vary, for example ranging from a simple device to a complex device. Functional circuitry 180 in one particular embodiment can comprise drive circuitry for driving a current-sensing feedback loop, a filter configured to work with a wide range of magnetic cores, an integrated H-Bridge (being an electronic switching circuit that enables a voltage to be applied across a load in either direction) which drives the compensation coil, a precision voltage reference and shunt sense amplifier to generate and drive the analog output signal.

Figure 2:
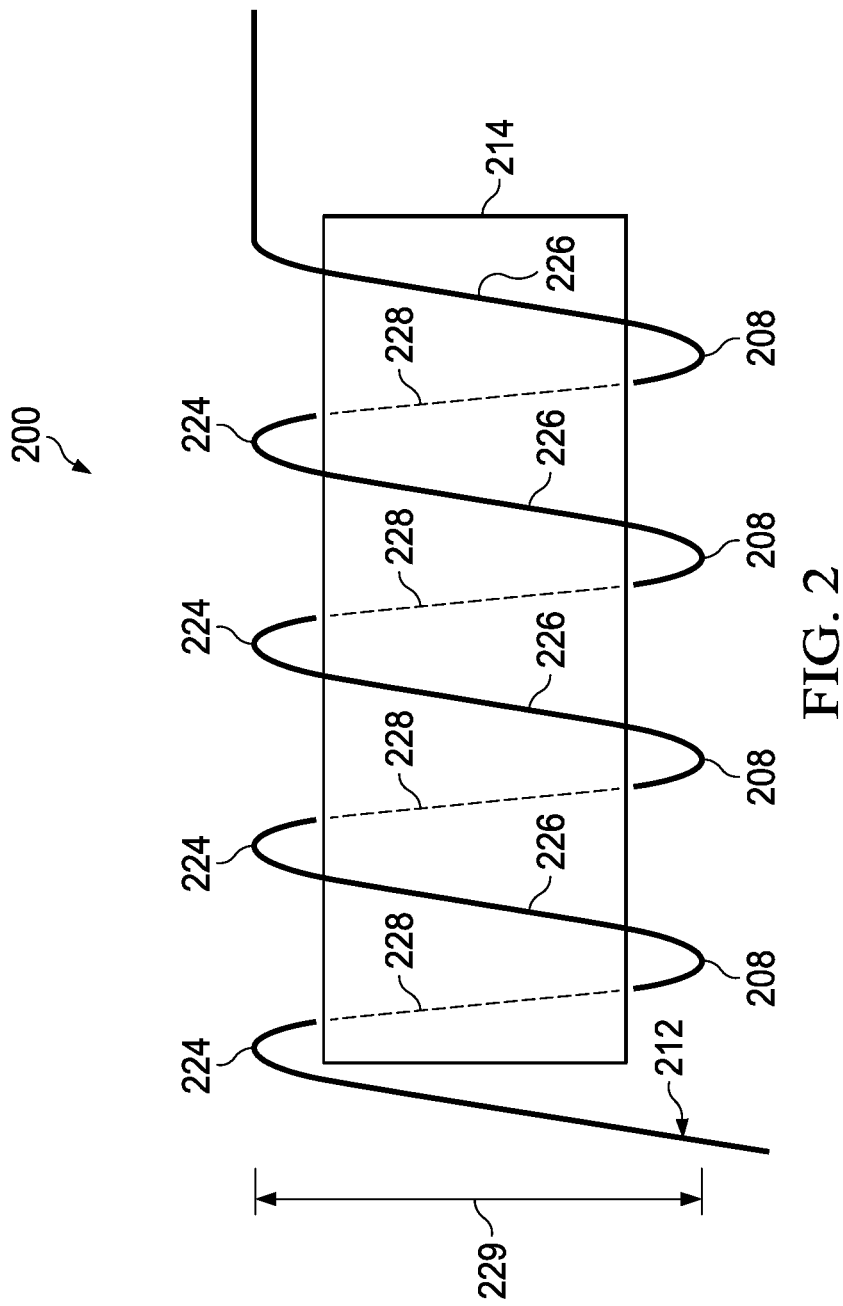
FIG. 2 is a depiction of a portion of an example integrated fluxgate sensor, according to an example embodiment.

FIG. 2 shows a portion of an example fluxgate sensor shown as (fluxgate sensor portion) 200, where the first metal leads 208 underlying the magnetic core 214 are connected to the second metal leads 224 overlying the magnetic core 214 by vias 226 in front of the magnetic core 214 and by vias 228 behind the magnetic core 214. Although only one coil 212 is shown, two or more coils are typically formed around the magnetic core 214 to form the fluxgate sensor portion 200. The width or short-axis in-plane direction (y-direction for an xy plane with the core's thickness being in the z-direction) for the magnetic core 214 shown by arrow 229 is used as the magnetic field direction for disclosed magnetic field annealing of the magnetic core 214.

Figure 3C:
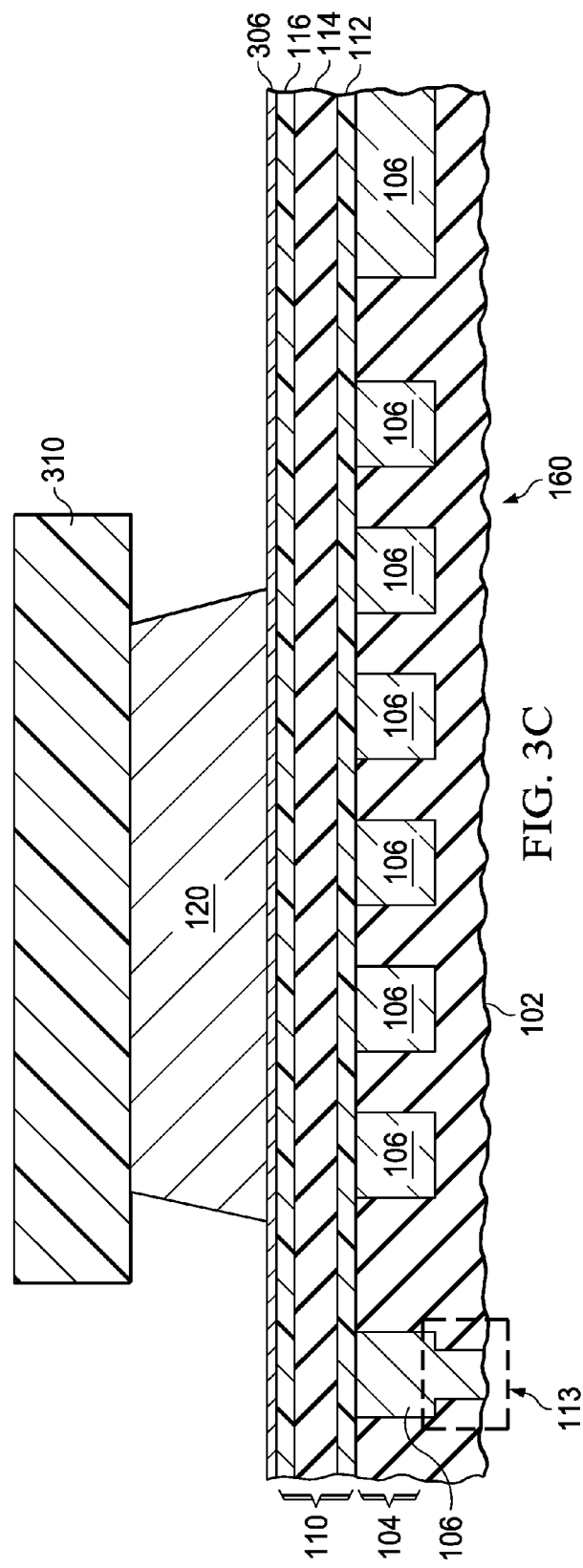

FIG. 3A through FIG. 3F are cross sectional depictions of the fluxgate sensor 160 shown in FIG. 1 depicted in successive stages of fabrication, where the substrate 101 and semiconductor surface layer 105 are not shown. Referring to FIG. 3A, the first dielectric stack 110 is formed over lower layers, such as over the semiconductor surface layer 105 on substrate 101 of the IC 100 as shown in FIG. 1. The first dielectric layer shown in the first dielectric stack 110 is a first etch stop layer 112. The first etch stop layer 112 may be silicon nitride and may be formed by PECVD using silane, ammonia and nitrogen gases, to provide desired etch selectivity to subsequently formed overlying layers of silicon dioxide-based dielectric materials. The first dielectric layer 112 also can provide a diffusion barrier to copper in the underlying leads of the first metal layer 106.

The second dielectric layer 114 in the first dielectric stack 110 may be a silicon dioxide-based dielectric material about 500 nm to about 1000 nm thick formed by PECVD using tetraethyl orthosilicate, also known as tetraethoxysilane (TEOS), or other suitable process. The third dielectric layer in the first dielectric stack 110 is a second etch stop layer 116. The second etch stop layer 112 may be silicon nitride with a thickness between about 35 nm to 150 nm formed by PECVD using silane, ammonia and nitrogen gases, to provide desired etch selectivity to a subsequent plasma titanium etch.

FIG. 3B shows the in-process fluxgate sensor after deposition of a first encapsulation layer of titanium (first titanium layer) 306 on second etch stop layer 116, a magnetic core material 308 deposited onto the first titanium layer 306, and a magnetic core pattern 310 is formed over the magnetic core material 308 and exposes the magnetic core material 308. The first titanium layer 306 may have a thickness in the range of about 30 to 50 nm and may be deposited by physical vapor deposition (PVD) techniques such as sputtering or CVD techniques. Titanium has the advantage of providing stress relief between the underlying first dielectric stack 110 and the subsequently deposited magnetic core material. This eliminates delamination of the magnetic core material and significantly reduces cracks that may be formed in the underlying first dielectric stack 110 due to stress. In addition, for the magnetic core comprising NiFe permalloy the first titanium layer 306 provides a surface for grain growth which is beneficial for fluxgate electrical properties.

The thickness of the magnetic core material 308 depends upon the specifications of the fluxgate sensor being formed. In an example fluxgate magnetometer the magnetic core material layer 308 is a multi-layer laminate stack of permalloy and AlN with a thickness of about 1.5 microns. The magnetic core pattern 310 may comprise photoresist formed by a photolithographic process, and can include an anti-reflection (AR) layer and/or a hard mask layer.

Referring to FIG. 3C, the magnetic core material layer 308 is etched from the regions exposed by the magnetic core pattern 310 to form the magnetic core 120. The magnetic core material 308 may be etched using a plasma etch or may be wet etched. The etch chemistry depends upon the magnetic core material. In an example fluxgate magnetometer the magnetic core material 308 is a multilayer laminate of permalloy and AlN and is etched with wet etchant containing phosphoric acid, acetic acid, and nitric acid.

Figure 3D:
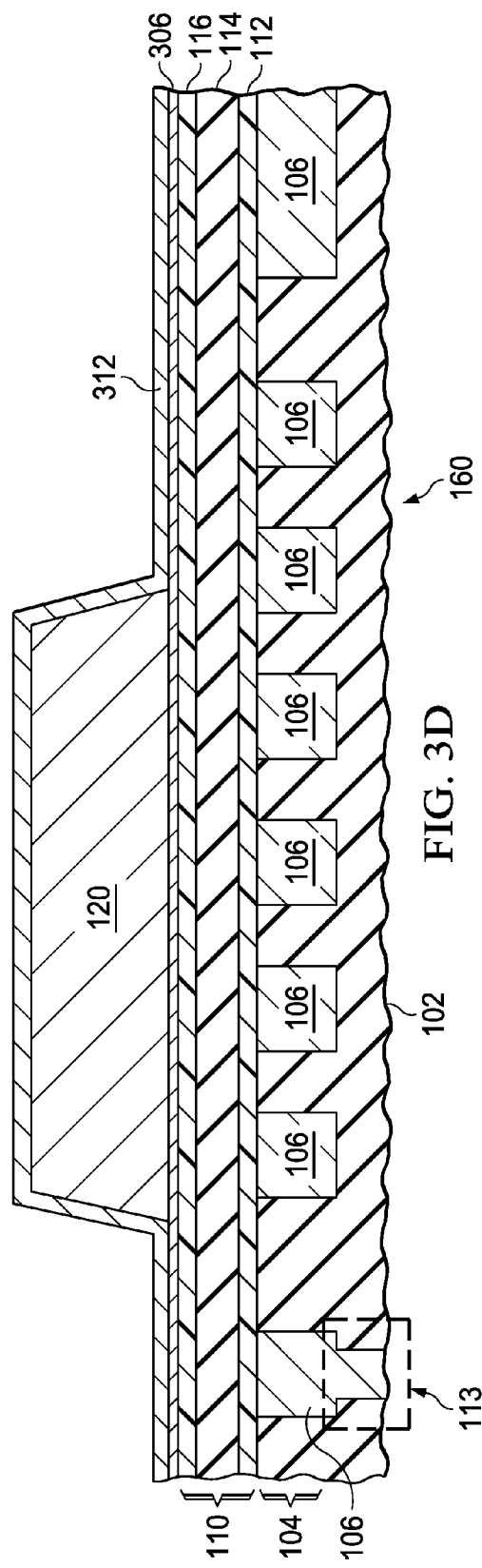

Referring to FIG. 3D, the magnetic core pattern 310 is removed and a second encapsulation layer of titanium layer (second titanium layer) 312 is deposited over the magnetic core 120 and over the first titanium layer 306. The second titanium layer 312 may have a thickness in the range of about 90 nm to 300 nm and may be deposited by PVD techniques such as sputtering or CVD techniques. The second titanium layer 312 has the advantage of providing stress relief between the magnetic core 120 and subsequently deposited dielectric layers. This eliminates delamination and significantly reduces cracks that may form in surrounding dielectric layers due to stress.

Figure 3E:
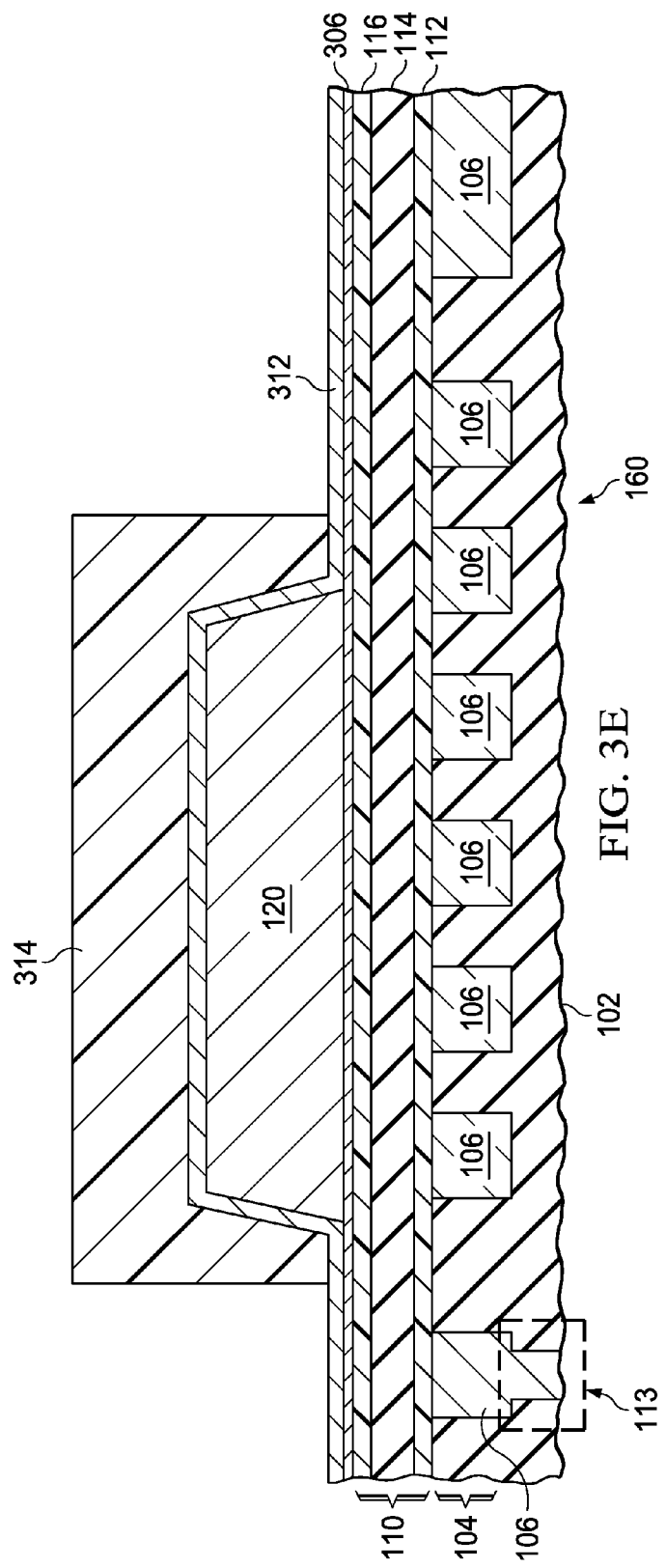

Referring to FIG. 3E, an encapsulation etch pattern 314 is formed over the magnetic core 120 and extends laterally generally at least about 1.5 microns on all sides past the magnetic core 120. The encapsulation etch pattern 314 exposes the second titanium layer 312 and first titanium layer 306 outside of the magnetic core 120 region.

Figure 3F:
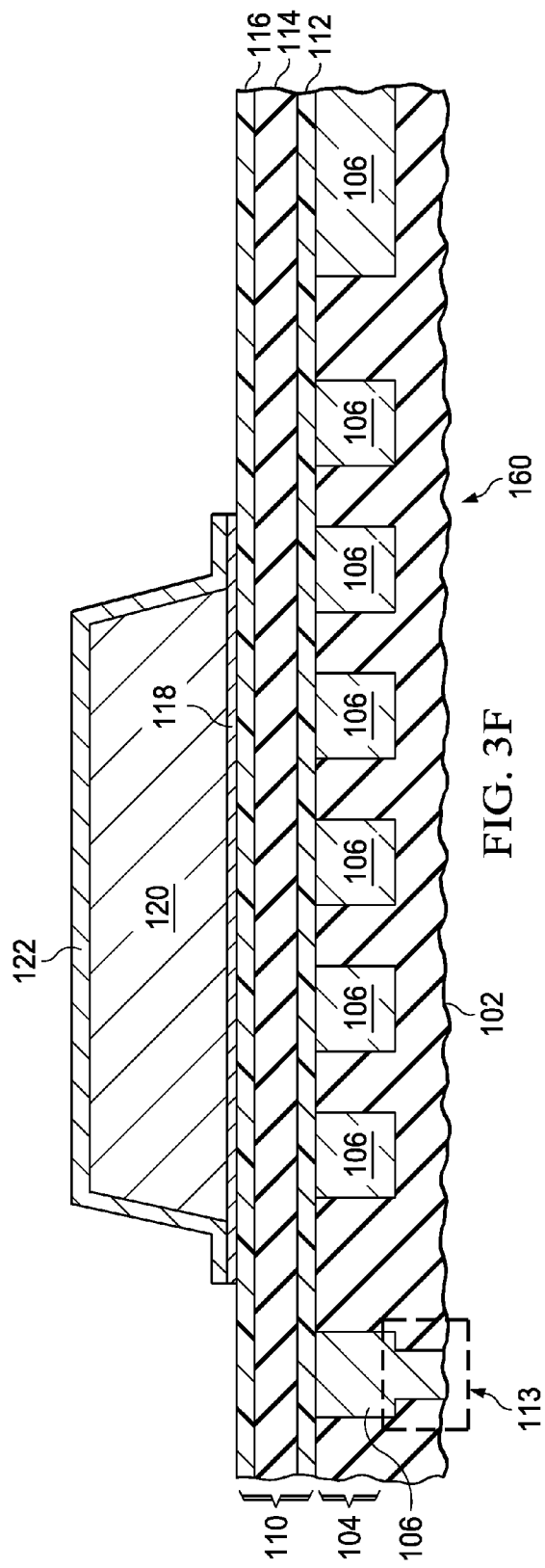

As shown in FIG. 3F, the second titanium layer 312 exposed by the titanium etch pattern 314 shown in FIG. 3E is etched away to provide the second titanium layer 122. The second titanium layer 122 encapsulates the top and sides of the magnetic core 120. The first titanium layer 306 exposed by the titanium etch pattern is also etched away. The portion of the first titanium layer 118 protected by the magnetic core pattern 310 and the magnetic core 120 remains and encapsulates the bottom of the magnetic core 120. As noted above, the first titanium layer 118 and second titanium layer 122 generally laterally extend past the magnetic core 120 by about 1.5 to 3 microns. The titanium encapsulation provides stress relief between the magnetic core 120 and surrounding dielectric layers and prevents delamination of the magnetic core 120. In addition it almost eliminates stress cracking in dielectric layers that surround the magnetic core 120. Fabrication of the IC is continued to complete the fluxgate sensor structure of FIG. 1 and the functional circuitry 180.

Figure 4:
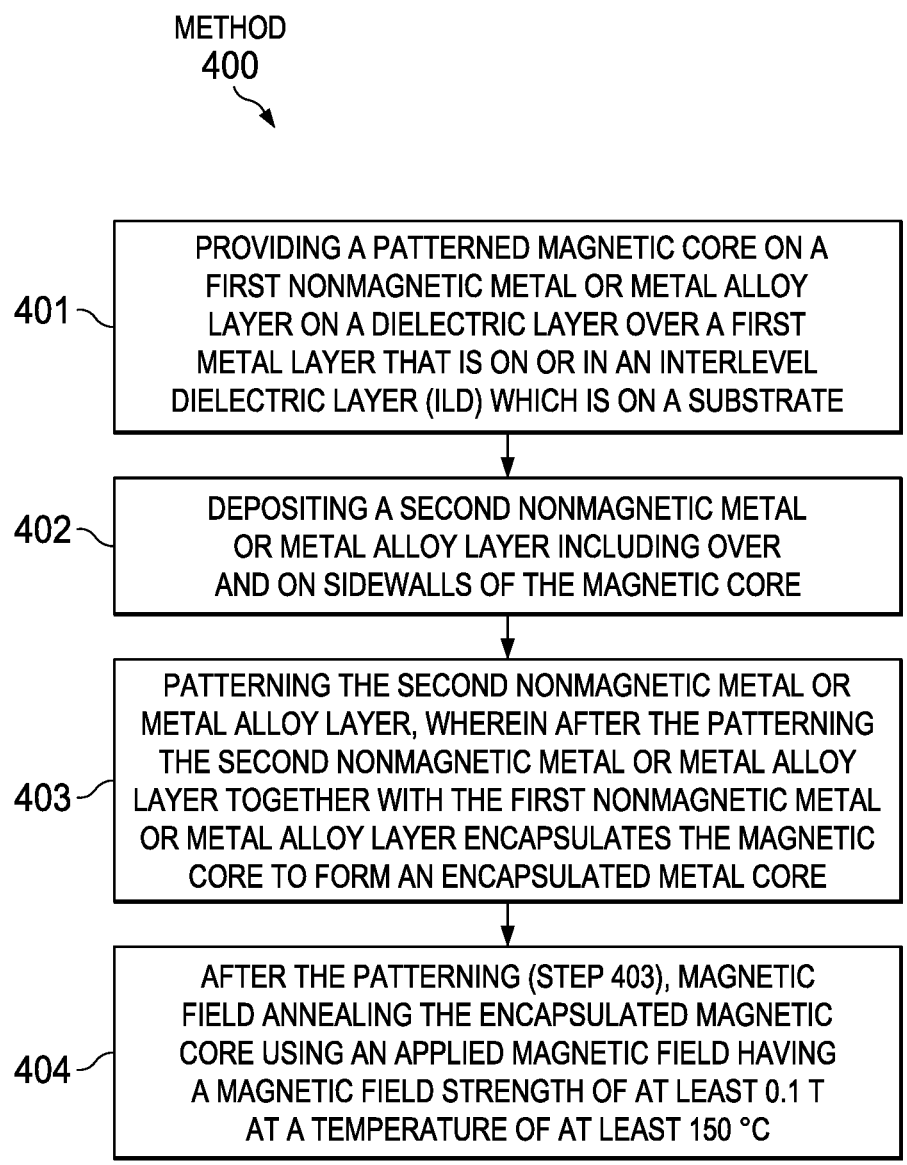
FIG. 4 is a flow chart that shows steps in an example method of forming integrated fluxgate sensors on ICs, according to an example embodiment.

FIG. 4 is a flow chart that shows steps in an example method 400 of forming integrated fluxgate sensors on ICs, according to an example embodiment. Step 401 comprises providing a patterned magnetic core 120 on a first nonmagnetic metal or metal alloy layer described above as first titanium layer 118 on a first dielectric stack 110 over a first metal layer 106 that is on or in an ILD 102 which is on a substrate 101, such as on a surface semiconductor layer 105 on a substrate 101. The magnetic core 120 can comprise permalloy, NiFeMo, CoNbZr, or CoTaZr. For example, as noted above the magnetic core can comprise a multilayered stack of alternating layers of magnetic core material and a dielectric selected from aluminum oxide, silicon dioxide and aluminum nitride.

The IC can include first vias 113 through the ILD 102 for coupling the fluxgate sensor to functional circuitry 180 formed on the substrate. In some embodiments the substrate can comprise a silicon wafer and the functional circuitry 180 can comprise a plurality of: drive circuitry for driving a current-sensing feedback loop, a filter configured to work with the magnetic core, an H-Bridge circuit, a voltage reference, and a shunt sense amplifier.

Step 402 comprises depositing a second nonmagnetic metal or metal alloy layer described above as a second titanium layer 122 including over and on sidewalls of the magnetic core 120. As noted above, the first nonmagnetic metal or metal alloy layer and second nonmagnetic metal or metal alloy layer that together provide encapsulation for the magnetic core 120 can both comprise Ti. Step 403 comprises patterning the second nonmagnetic metal or metal alloy layer, wherein after the patterning the second nonmagnetic metal or metal alloy layer together with the first nonmagnetic metal or metal alloy layer encapsulates the magnetic core 120 to form an encapsulated magnetic core 120'.

The first nonmagnetic metal or metal alloy layer described above as first titanium layer 118 can extend past the magnetic core by at least about 1.5 microns on all sides and the second nonmagnetic metal or metal alloy layer described above as second titanium layer 122 can extend past the magnetic core by at least about 1.5 microns on all sides. The first nonmagnetic metal or metal alloy layer can have a thickness in the range of 30 nm to 50 nm and wherein the second nonmagnetic metal or metal alloy layer can have a thickness in the range of 90 nm to 300 nm.

Step 404 comprises after the patterning (step 403), magnetic field annealing the encapsulated magnetic core 120' using an applied magnetic field having a magnetic field strength of at least 0.1 T at a temperature of at least 150° C. The magnetic field strength can be from 0.1 T to 2 T, such as a magnetic field strength from 0.7 T to 1.3 T, a temperature from 325° C. to 425° C., and a time at the temperature from 15 to 120 minutes. An ambient for the magnetic field annealing can be a non-oxidizing ambient comprising at least one of $N_2$, forming gas ($N_2/H_2$), and an inert gas. The magnetic field annealing can be performed without any gas flowing as well. A pressure during the magnetic field annealing can be from 1 Torr to 100 Torr.

The orientation of magnetic alignment used in step 404 is determined by the magnetic field generated by a permanent magnet or by a superconducting magnet. Examples of manufacturers of magnetic field furnaces include TEL Magnetic Solutions Limited and Futek Holdings, LLC. An in-plane magnetic field is applied along the width or short-axis direction as shown by arrow 229 in FIG. 2 A tesla (symbol T, commonly denoted as B) is a unit of measurement of the strength of the magnetic field, where one T is equal to one weber/$m^2$.

Disclosed methods of magnetic field annealing of integrated fluxgate sensors on ICs can be detected while the ICs are in completed wafer form (but not yet singulated into die). This alignment feature can be evidenced by magnetic domain imaging across the die of a wafer. However, the second titanium layer 122 (or other top encapsulating layer) generally needs to be removed in order to perform the magnetic domain imaging.

One distinctive feature obtained from disclosed magnetic field annealing is the improved across-wafer (die-to-die) uniformity of magnetic alignment of the magnetic cores. For example, the magnetic misalignment angle for the magnetic cores across die having disclosed magnetic flux sensors on an 8 inch (200 mm) diameter wafer (outside an edge exclusion zone of 3 mm) has been found to provide at least 95% of the die having a magnetic misalignment angle within 20 degrees (±10 degrees with respect to the width or short-axis direction of the magnetic core) after disclosed magnetic field annealing. This high degree of magnetic alignment is essentially the same as the magnetic alignment obtained by the same annealing conditions when the wafer was magnetic field annealed right after forming the magnetic core, which as described above unlike disclosed magnetic field annealing of encapsulated magnetic cores does not cause structural defects including cracks and delamination of the magnetic core due to thermal expansion mismatches.

Disclosed embodiments can be used to form semiconductor die that may be integrated into a variety of assembly flows to form a variety of different fluxgate sensor devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of forming an integrated fluxgate sensor, comprising:
 providing a patterned magnetic core on a first nonmagnetic metal or metal alloy layer on a dielectric layer over a first metal layer that is on or in an interlevel dielectric layer (ILD) which is on a substrate;
 depositing a second nonmagnetic metal or metal alloy layer including over and on sidewalls of said magnetic core;
 patterning said second nonmagnetic metal or metal alloy layer, wherein after said patterning said second nonmagnetic metal or metal alloy layer together with said first nonmagnetic metal or metal alloy layer encapsulates said magnetic core to form an encapsulated magnetic core, and
 after said patterning, magnetic field annealing said encapsulated magnetic core using an applied magnetic field having a magnetic field strength of at least 0.1 T at a temperature of at least 150° C.

2. The method of claim 1, further comprising forming vias through said ILD for coupling said fluxgate sensor to functional circuitry formed on said substrate.

3. The method of claim 2, wherein said substrate comprises a silicon wafer and said functional circuitry comprises a plurality of: drive circuitry for driving a current-sensing feedback loop, a filter configured to work with said magnetic core, an H-Bridge circuit, a voltage reference, and a shunt sense amplifier.

4. The method of claim 1, wherein said first nonmagnetic metal or metal alloy layer and said second nonmagnetic metal or metal alloy layer both comprise Ti.

5. The method of claim 1, wherein said magnetic field annealing has a magnetic field strength of 0.7 T to 1.3 T, said temperature is from 325° C. to 425° C., and a time at said temperature is from 15 to 120 minutes.

6. The method of claim 1, wherein an ambient for said magnetic field annealing is a non-oxidizing ambient comprising at least one of $N_2$, forming gas, and an inert gas.

7. The method of claim 1, wherein a pressure during said magnetic field annealing is from 1 Torr to 100 Torr.

8. The method of claim 1, wherein said magnetic core comprises permalloy, NiFeMo, CoNbZr, or CoTaZr.

9. The method of claim 8, wherein said magnetic core comprises a multilayered stack of alternating layers of magnetic core material and a dielectric material selected from a group consisting of aluminum oxide, silicon dioxide, aluminum nitride, and combinations thereof.

10. The method of claim 1, wherein said first nonmagnetic metal or metal alloy layer extends past said magnetic core by at least about 1.5 microns on all lateral sides and said second nonmagnetic metal or metal alloy layer extends past said magnetic core by at least about 1.5 microns on all lateral sides.

11. The method of claim 10, wherein said first nonmagnetic metal or metal alloy layer has a thickness in a range of 30 nm to 50 nm and wherein said second nonmagnetic metal or metal alloy layer has a thickness in a range of 90 nm to 300 nm.

12. A method of forming an integrated fluxgate sensor, comprising:
 providing a patterned magnetic core on a first nonmagnetic metal or metal alloy layer comprising Ti on a dielectric layer over a first metal layer that is on or in an interlevel dielectric layer (ILD) which is on a substrate;
 depositing a second nonmagnetic metal or metal alloy layer comprising Ti including over and on sidewalls of said magnetic core;
 patterning said second nonmagnetic metal or metal alloy layer, wherein after said patterning said second nonmagnetic metal or metal alloy layer together with said first nonmagnetic metal or metal alloy layer encapsulates said magnetic core to form an encapsulated magnetic core, and
 after said patterning, magnetic field annealing said encapsulated magnetic core using an applied magnetic field having a magnetic field strength of 0.7 T to 1.3 T at a temperature from 325° C. to 425° C. with a pressure between 1 Torr and 100 Torr.

13. The method of claim 12, wherein said magnetic field annealing is under a $N_2$ atmosphere and a time at said temperature is from 15 to 120 minutes.

14. The method of claim 12, further comprising forming vias through said ILD for coupling said fluxgate sensor to functional circuitry formed on said substrate.

15. The method of claim 14, wherein said substrate comprises a silicon wafer and said functional circuitry comprises a plurality of: drive circuitry for driving a current-sensing feedback loop, a filter configured to work with said magnetic core, an H-Bridge circuit, a voltage reference, and a shunt sense amplifier.

* * * * *